US009543460B2

(12) United States Patent
Kretschmann et al.

(10) Patent No.: US 9,543,460 B2
(45) Date of Patent: Jan. 10, 2017

(54) CURABLE POLYORGANOSILOXANE COMPOSITION FOR USE AS AN ENCAPSULANT FOR A SOLAR CELL MODULE

(75) Inventors: Oliver Kretschmann, Düsseldorf (DE); Christian de Santis, Duisburg (DE); Andrea Ruppenthal, Leverkusen (DE)

(73) Assignee: Momentive Performance Materials GmbH, Leverkusen (DE)

( * ) Notice: Subject to any disclaimer, the term of this patent is extended or adjusted under 35 U.S.C. 154(b) by 0 days.

(21) Appl. No.: 13/581,622

(22) PCT Filed: Mar. 4, 2011

(86) PCT No.: PCT/EP2011/053310
§ 371 (c)(1),
(2), (4) Date: Oct. 11, 2012

(87) PCT Pub. No.: WO2011/107592
PCT Pub. Date: Sep. 9, 2011

(65) Prior Publication Data
US 2013/0059109 A1    Mar. 7, 2013

(30) Foreign Application Priority Data
Mar. 5, 2010  (EP) ..................................... 10155654

(51) Int. Cl.
| | | |
|---|---|---|
| *C08G 77/08* | (2006.01) | |
| *H01L 31/048* | (2014.01) | |
| *C08L 83/04* | (2006.01) | |
| *H01L 31/18* | (2006.01) | |
| *C08G 77/12* | (2006.01) | |
| *C08G 77/20* | (2006.01) | |
| *C08K 3/36* | (2006.01) | |
| *C08K 5/5419* | (2006.01) | |
| *C08K 5/5435* | (2006.01) | |
| *C08K 5/544* | (2006.01) | |
| *C08K 5/549* | (2006.01) | |

(52) U.S. Cl.
CPC ........... *H01L 31/0481* (2013.01); *C08L 83/04* (2013.01); *H01L 31/18* (2013.01); *C08G 77/12* (2013.01); *C08G 77/20* (2013.01); *C08K 3/36* (2013.01); *C08K 5/549* (2013.01); *C08K 5/5419* (2013.01); *C08K 5/5435* (2013.01); *C08K 5/5442* (2013.01); *Y02E 10/50* (2013.01); *Y10T 428/239* (2015.01); *Y10T 428/31612* (2015.04); *Y10T 428/31663* (2015.04)

(58) Field of Classification Search
CPC ...................................................... C08L 83/04
See application file for complete search history.

(56) References Cited

U.S. PATENT DOCUMENTS

| | | | |
|---|---|---|---|
| 4,143,949 A † | 3/1979 | Chen | |
| 4,167,644 A † | 9/1979 | Kurth | |
| 4,322,261 A † | 3/1982 | Dubois | |
| 4,461,922 A † | 7/1984 | Gay | |
| 4,490,500 A † | 12/1984 | Smith | |
| 4,578,526 A † | 3/1986 | Nakano | |
| 4,855,378 A † | 8/1989 | Pradl | |
| 4,868,251 A † | 9/1989 | Reich | |
| 5,021,494 A | 6/1991 | Toya | |
| 5,445,891 A * | 8/1995 | Kasuya | 428/450 |
| 5,527,932 A † | 6/1996 | Kasuya | |
| 6,175,075 B1 † | 1/2001 | Shiotsuka | |
| 6,201,092 B1 * | 3/2001 | Hara | 528/15 |
| 7,288,322 B2 * | 10/2007 | Bosshammer | 428/447 |
| 8,071,707 B2 * | 12/2011 | Kashiwagi | C08G 77/20 528/31 |
| 8,088,878 B2 * | 1/2012 | Koellnberger | 528/15 |
| 2002/0037963 A1 | 3/2002 | Hara et al. | |
| 2003/0236380 A1 * | 12/2003 | Fehn et al. | 528/12 |
| 2004/0178509 A1 | 9/2004 | Yoshino et al. | |
| 2005/0089696 A1 | 4/2005 | Bosshammer | |
| 2006/0014915 A1 * | 1/2006 | Ahn et al. | 528/15 |
| 2006/0207646 A1 | 9/2006 | Terreau et al. | |
| 2006/0264583 A1 | 11/2006 | Kashiwagi et al. | |
| 2006/0270792 A1 | 11/2006 | Kashiwagi | |
| 2007/0032595 A1 | 2/2007 | Yamakawa et al. | |
| 2007/0264510 A1 | 11/2007 | Fehn | |
| 2008/0033071 A1 * | 2/2008 | Irmer et al. | 522/66 |
| 2009/0068475 A1 * | 3/2009 | Bosshammer | C08J 7/047 428/447 |
| 2013/0071673 A1 * | 3/2013 | Okawa | C09J 183/04 428/447 |
| 2015/0337188 A1 * | 11/2015 | Sakakibara | C09J 5/04 156/307.1 |

FOREIGN PATENT DOCUMENTS

| | | |
|---|---|---|
| EP | 0398701 A2 | 11/1990 |
| EP | 1801163 | 6/2007 |

(Continued)

OTHER PUBLICATIONS

International Preliminary Report on Patentability for corresponding PCT/EP2011/053310 mailed Sep. 20, 2012, 12 pages.
Espacenet Bibliographic Abstract for JP 2009-235265 published Oct. 15, 2009, two pages.

(Continued)

*Primary Examiner* — Margaret Moore
(74) *Attorney, Agent, or Firm* — Rankin, Hill & Clark LLP

(57) ABSTRACT

The invention relates to curable polyorganosiloxane compositions for the use as an encapsulant for a solar cell module, in particular, for the encapsulation of photovoltaic modules, cured polyorganosiloxane composition made therefrom and photovoltaic modules comprising the same as encapsulant.

16 Claims, No Drawings

(56) References Cited

FOREIGN PATENT DOCUMENTS

| | | | |
|---|---|---|---|
| EP | 2058377 A1 | | 5/2009 |
| GB | 2084793 A | † | 4/1982 |
| JP | 06-016942 | | 1/1994 |
| JP | 11-103085 | | 4/1999 |
| JP | 2003086822 A | † | 3/2003 |
| JP | 2006-335857 | | 12/2006 |
| JP | 2009-206160 | | 9/2009 |
| JP | 2009-235265 | | 10/2009 |
| WO | 2005/006451 A1 | | 1/2005 |
| WO | 2005006451 A1 | † | 1/2005 |
| WO | 2008/103227 | | 8/2008 |
| WO | 2009/037156 A1 | | 3/2009 |
| WO | 2009/092762 | * | 7/2009 |

OTHER PUBLICATIONS

International Search Report for corresponding PCT/EP2011/053310 mailed Jul. 13, 2011, seven pages.
International Preliminary Report on Patentability for corresponding PCT/EP2011/053310 mailed Sep. 20, 2012, 10 pages.
Third Party Observation in the name of Momentive Performance Materials GmbH, dated Aug. 26, 2013, 13 pages.
Patent Abstract and partial translation for JP Publication No. 2009-206160 published Sep. 10, 2009, 17 pages.
Patent Abstract and partial translation for JP Publication No. 11-103085 published Apr. 13, 1999, nine pages.
Patent Abstracts of Japan, Publication No. JP 06-016942, 1 page.
English Abstract of JP 2006-335857, 2 pages.
European Search Report dated Oct. 7, 2010, Application No. 10155654.6, 11 pages.
Author: Dow Corning; Title: Application_Notes; Single page; 1977; Available worldwide; Published US.†
Beatty, M.E.; Woerner, C.V.; Crouch, R.K.; Thermal and Particulate Radiation Effects on Potting Polymers; 973, 974; Dec. 1, 1970; Journal of Materials, vol. 5, No. 4; Published in the US.†
Carmichel, D.C.; Gaines, G.B.; Sliemers, F.A.; Kistler, C.W.; lgou, R.D.; Review of World Experience and Properties of Materials for Encapsulation of Terrestial Photovoltaic Arrays; 76, 77 and 99; Jul. 21, 1976; Battelle Columbus Laboratories.†
Author: ShinEtsu; Parts Catalog; 38-39; Nov. 1, 1995; Available worldwide; Published in Japan.†

\* cited by examiner
† cited by third party

CURABLE POLYORGANOSILOXANE COMPOSITION FOR USE AS AN ENCAPSULANT FOR A SOLAR CELL MODULE

The present invention relates to curable polyorganosiloxane compositions for the use as an encapsulant for a solar cell module, in particular, for the encapsulation of photovoltaic modules, cured polyorganosiloxane composition made therefrom and photovoltaic modules comprising the same as encapsulant. Suitably the curable polyorganosiloxane composition are liquid at room temperature (25° C.) in the uncured state, and cure to elastomers and develop permanent adhesion, in particular, to adjacent glass and plastic substrates, with firm adhesion particularly after long term outside weathering or after corresponding accelerated ageing tests.

In a typical photovoltaic solar cell module crystalline or amorphous semiconductor solar cells, are interconnected, mechanically supported and protected against environmental degradation by integrating the cells into a laminated structure. The modules usually comprise a transparent front panel or substrate, preferably made from glass and a rear "backskin" or superstrate usually a plastic or a metal sheet and sometimes glass. The semiconductor solar cells are usually partly or completely encapsulated by an encapsulating material, and interconnected solar cells are located between the front panel and the backskin.

Different materials have been considered or used as encapsulants. In the early use of solar modules for extraterrestrial applications silicone encapsulants were the materials of choice because of their excellent insulating properties and their stability against extreme temperature conditions and radiation. See for example P. Berman and R. K. Yasui, Technical report 32-7547, Jet Propulsion Laboratory, Californian Institute of Technology, 1971. Typically, silicone compositions curable by the reaction of a SiH-group with a silicon bonded alkenyl group, so called addition cure materials were described in the patent literature such as Sylgard 182 or 184 from Dow Corning Corp. or RTV 615 from General Electric e.g. in U.S. Pat. No. 4,056,405, U.S. Pat. No. 4,093,473, U.S. Pat. No. 4,143,949 or U.S. Pat. No. 4,167,644. Later the silicone encapsulants were found to be too expensive or too complicated for broad use in terrestrial modules. Organic polymers became more important with ethylene vinyl acetate copolymer (EVA) considered the best encapsulant for modules with crystalline solar cells. However, EVA tends to discolor with time under the influence of sunlight, a process, which reduces the efficiency of the module. Another disadvantage is the need of vacuum laminators for the production of EVA encapsulated modules. To avoid this time consuming and complicated process, a process would be desirable for an economical module production. Silicone encapsulants have again become a matter of interest and especially the addition cure materials because of the absence of curing by-products (WO 2005/006451 A1). One of the most important conditions for the applicability of silicones is adhesion to the substrates, which are in contact with the encapsulant.

Addition cure silicone materials usually do not well adhere to most substrates. Over the years a large number of patents and scientific publications have been published describing addition cure materials with adhesive properties (e.g. U.S. Pat. No. 3,699,072, U.S. Pat. No. 3,892,707, U.S. Pat. No. 4,077,943, U.S. Pat. No. 4,082,726, U.S. Pat. No. 4,087,585, U.S. Pat. No. 4,245,079, U.S. Pat. No. 4,257,936, U.S. Pat. No. 4,677,161, U.S. Pat. No. 4,701,503, U.S. Pat. No. 4,721,764, U.S. Pat. No. 4,912,188, U.S. Pat. No. 5,051,467, U.S. Pat. No. 5,106,933, U.S. Pat. No. 5,312,855, U.S. Pat. No. 5,364,921, U.S. Pat. No. 5,438,094, U.S. Pat. No. 5,516,823, U.S. Pat. No. 5,536,803, U.S. Pat. No. 6,743,515, U.S. Pat. No. 7,119,159, U.S. Pat. No. 7,288,322, US20030236380; US20050089696; WO2008103227; Toshio Suzuki and Akira Kasuya, J. Adhesion Sci. Technol. Vol. 3, No. 6 pp 463-473, 1989) reflecting the great diversification and complexity of adhesion phenomena and demonstrating the different adhesion problems which cannot be solved with the same additives but often need specific solutions. Many of the patents were directed towards the production of composites consisting of thermoplastic materials and silicone. Others were designed to use silicone as an adhesive on metal substrates. Glass is also mentioned as substrate in some cases. However, in these documents only adhesive properties of the initially cured silicone compositions are reported if any. For use in photovoltaic solar cell applications, however, any encapsulant must not only provide excellent initial adhesion properties but must also provide excellent long-term adhesion properties having regard to the usually guaranteed life times of photovoltaic solar cell modules of up to 25 years and having regard to the extreme weathering conditions including extreme temperature differences, humidity, UV-light, etc. to which the photovoltaic solar cell modules are exposed to.

Furthermore the encapsulants of photovoltaic solar cell modules must not release volatile components during their operation time that may lead to corrosion or fogging of the cell module materials, which in turn may lead to failure or reduced efficacy of the photovoltaic solar cell modules.

Further requirements for encapsulants of photovoltaic solar cell modules apart from the above mentioned requirements, are the need for simultaneous primerless adhesion to different substrates involved in the manufacture of photovoltaic solar cell modules, including glass, coated glass and to other substrates, like metal, polymers etc. Primerless adhesion is needed for a cost efficient production process of photovoltaic modules. Further requirements of an economic high efficient production are high curing speeds and low temperatures for crosslinking and development of adhesion.

A number of publications deals with the encapsulation of semiconductor devices, including LEDs or ICs (JP2009235265; US20060270792; US20070032595; JP6016942; U.S. Pat. No. 5,021,494; JP2006335857; US20040178509; US20020037963; EP1801163). However, the requirements for such semiconductor devices are less severe, because usually exposure to moisture, temperature changes and thermal expansion due to this, acid rain exposure, sun light exposure are low compared to solar modules. Also the substrates used in the encapsulation of semiconductor devices are different from those used in solar modules. In solar modules used in the inventions special glasses and films are used that are not used in semiconductor devices.

WO 2005/006451 A1 describes solar cell modules having cured silicone encapsulants obtained by various curing mechanism including hydrosilylation inter alia. Various types of SiH crosslinkers, including solely Si—H terminated crosslinkers are mentioned, which, however, are not specified in view of long term service life. Also the examples do not provide a clear disclosure about the nature of the SiH-crosslinkers. It appears that Si-crosslinkers with low Si-contents have been used.

The present invention is based on the discovery that a silicone encapsulant for photovoltaic modules that satisfies the above mentioned needs require a special selection of SiH crosslinkers. The specific curable polyorganosiloxane compositions of the invention pass accelerated ageing tests, without failure or reduction of the efficacy of the photovoltaic solar cell modules and can be cured at low temperatures.

By the present invention is provided a curable polyorganosiloxane composition for the use as an encapsulant, said composition comprising:

(A) at least one polyorganosiloxane having at least two unsaturated hydrocarbyl residues,
(B) at least one polyorganohydrogensiloxane having at least seven Si atoms, wherein the molar ratio of SiH-groups to all Si-atoms is more than 0.55,
(C) at least one hydrosilylation catalyst,
(D) optionally at least one adhesion promoter,
(E) optionally at least one reinforcing filler, wherein the molar ratio of the total of SiH groups in component (B) to the total of the unsaturated hydrocarbyl residues in component (A) in the formulation is between 0.7 and 4, preferably 1 and 4, wherein the encapsulant is for a solar cell module.

The term encapsulant as used in the present invention shall includes but is not limited to a material that covers partly or completely a substrate, including semiconductor elements (in particular photovoltaic solar cell semiconductor elements), glass substrates, metal substrates, plastic substrates etc., all for a solar cell module, in particular, of a photovoltaic solar cell module. "Partly" may include in the context of the present invention the case where a substrate, including semiconductor elements, glass substrates, metal substrates, plastic substrates etc., all for a solar cell module, in particular, of a photovoltaic solar cell module, are only partly covered by the cured silicone composition, for example, to partly cover a semiconductor element, e.g. as a backlayer (opposite to the light receiving side) of a semiconductor element, and optionally of the conducting lines connected to the semiconductor elements in a solar cell module, in particular in photovoltaic solar cell modules. "Partly" may also include the use of the curable composition to partly coat part of the glass substrate and part of the semiconductor element (in particular the backside) at the same time, thereby forming, in particular, a complete envelope surrounding the semiconductor element in a solar cell module. "Partly" may also include the use of the curable composition to coat the semiconductor element on the surface (i.e. the side where the light enters the solar cell module). "Completely" may include in particular the case, where a substrate, including semiconductor elements, glass substrates, metal substrates, plastic substrates etc., all of a solar cell module, in particular of a photovoltaic solar cell module, is completely surrounded by the cured silicone composition. Further embodiments of photovoltaic solar cell modules using the silicone encapsulant of the present invention are explained below. The silicone encapsulant of the present invention is characterized by an improved adhesion towards several possible materials used in photovoltaic solar cell modules, including glass substrates, with and without coatings, barrier foils, such as those made of fluoro thermoplastics or EVA copolymers, semiconductor elements, such as crystalline or polycrystalline silicon or thin film silicon, e. g. amorphous, semi crystalline silicon, gallium arsenide, copper indium diselenide, cadmium telluride, copper indium gallium diselenide. Furthermore the silicone encapsulant of the present invention is characterized by an improved adhesion towards these substrates over a long period of time under severe conditions of high temperature changes at high humidity. In a preferred embodiment the silicone encapsulant of the present invention is in contact with a glass substrate and a barrier foil, preferably a back skin foil, at the same time, optionally contacting the semiconductor elements.

Component (A)

The inventive composition comprises at least one polyorganosiloxane having at least two unsaturated hydrocarbyl residues (component (A)). Component (A) may include one or more polyorganosiloxanes having in average at least two alkenyl groups. Suitable components (A) can be described by the general formula (4), $$[M_a D_b T_c Q_d R^9{}_e]_m \quad (4)$$

wherein the indices in formula (4) represent the ratios of the siloxy units M, D, T and Q, which can be distributed blockwise or randomly in the polysiloxane. Within a polysiloxane each siloxane unit can be identical or different and a=0–10
b=0–2000
c=0–50
d=0–1
e=0–300
m=1–1000 with a, b, c, d and m being such that the viscosity of component (A) at 25° C. is less than 50000 mPa·s (measured at a shear rate of D=1 s$^{-1}$ at 25° C.).

The viscosity of component (A) refers to the viscosity of a single component (A) or a mixture of components (A). The latter case of the mixture includes with it the presence of individual components (A) that may have a viscosity exceeding 50000 mPa·s at 25° C., for example resinous components (A) that comprise Q and or T units.

In formula (4) the indices should represent the average polymerisation degree $P_n$ based on the average number molecular mass $M_n$.

In the formula (4):
M=$R_3SiO_{1/2}$, or M*
D=$R_2SiO_{2/2}$, or D*
T=$RSiO_{3/2}$, or T*
Q=$SiO_{4/2}$,
divalent $R^9$, which are bridging groups between siloxy groups above, wherein each R, which may be the same or different, is selected from optionally substituted alkyl with up to 30 carbon atoms, optionally substituted aryl with up to 30 carbon atoms, poly($C_2$-$C_4$)-alkylene ether with up to 1000 alkylene oxy units, the groups R being free of aliphatic unsaturation, and
wherein M*=$R^1{}_p R_{3-p}SiO_{1/2}$, D*=$R^1{}_q R_{2-q}SiO_{2/2}$, T*=$R^1 SiO_{3/2}$,
wherein
p=0–3, preferably 1–3,
q=1–2, and
$R^9$ is as defined below.

R is preferably selected from n-, iso, or tertiary alkyl, alkoxyalkyl, $C_5$-$C_{30}$-cyclic alkyl, or $C_6$-$C_{30}$-aryl, alkylaryl, which groups can be substituted in addition by one or more O-, N-, S- or F-atom, or poly($C_2$-$C_4$)-alkylene ethers with up to 500 alkylene oxy units the groups R being free of aliphatic unsaturation, Examples of suitable monovalent hydrocarbon radicals include alkyl radicals, preferably such as $CH_3$—, $CH_3CH_2$—, $(CH_3)_2CH$—, $C_8H_{17}$— and $C_{10}H_{21}$—, and cycloaliphatic radicals, such as cyclohexylethyl, aryl radicals, such as phenyl, tolyl, xylyl, aralkyl radicals, such as benzyl and 2-phenylethyl. Preferable monovalent halohydrocarbon radicals have the formula $C_nF_{2n+1}CH_2CH_2$— wherein n has a value of from 1 to 10, such as, for example, $CF_3CH_2CH_2$—, $C_4F_9CH_2CH_2$—, $C_6F_{13}CH_2CH_2$—, $C_2F_5$—O($CF_2$—$CF_2$—O)$_{1-10}CF_2$—,  F[CF($CF_3$)—$CF_2$—O]$_{1-5}$—($CF_2$)$_{0-2}$—, $C_3F_7$—OCF($CF_3$)— and $C_3F_7$—OCF($CF_3$)—$CF_2$—OCF($CF_3$)—.

Preferred groups for R are methyl, phenyl, 3,3,3-trifluoropropyl.

$R^1$ is selected from unsaturated groups, comprising C═C-group-containing groups (alkenyl groups), e.g.: n, iso, tertiary or cyclic alkenyl, $C_6$-$C_{30}$-cycloalkenyl, $C_8$-$C_{30}$-alkenylaryl, cycloalkenylalkyl, vinyl, allyl, methallyl, 3-butenyl, 5-hexenyl, 7-octenyl, ethyliden-norbornyl, styryl, vinylphenylethyl, norbornenyl-ethyl, limonenyl, optionally substituted by one or more O- or F-atoms, or C≡C-group-containing groups (alkinyl groups), optionally comprising one or more O- or F-atoms.

The alkenyl radicals are preferable attached to terminal silicon atoms, the olefin function is at the end of the alkenyl group of the higher alkenyl radicals, because of the more ready availability of the alpha-, omega-dienes used to prepare the alkenylsiloxanes.

Preferred groups for $R^1$ are vinyl, 5-hexenyl, cyclohexenyl, limonyl, styryl, vinylphenylethyl.

$R^9$ includes for example divalent aliphatic or aromatic n-, iso-, tertiary- or cycloalkylene with up to 14 carbon atoms, arylene or alkylenearyl groups. $R^9$ forms bridging elements between two siloxy units. The content of the $R^9$ groups does not exceed 30 mol. % preferably not exceed 20 mol. % of all siloxy units. Preferably $R^9$ is absent. Preferred examples of suitable divalent hydrocarbon groups $R^9$ include any alkylene residue, preferably such as —$CH_2$—, —$CH_2CH_2$—, —$CH_2(CH_3)CH$—, —($CH_2$)$_4$—, —$CH_2CH(CH_3)CH_2$—, —($CH_2$)$_6$—, —($CH_2$)$_8$— and —($CH_2$)$_{18}$—; cycloalkylene radical, such as cyclohexylene; arylene radicals, such as phenylene, xylene and combinations of hydrocarbon radicals, such as benzylene, i.e. —$CH_2CH_2$—$C_6H_4$—$CH_2CH_2$—, —$C_6H_4CH_2$—. Preferred groups are alpha, omega-ethylene, alpha, omega-hexylene or 1,4-phenylene.

Further examples include divalent halohydrocarbon radicals $R^9$ e.g. any divalent hydrocarbon group $R^9$ wherein one or more hydrogen atoms have been replaced by halogen, such as fluorine, chlorine or bromine. Preferable divalent halohydrocarbon residues have the formula —$CH_2CH_2$($CF_2$)$_{1-10}CH_2CH_2$— such as for example, —$CH_2CH_2CF_2CF_2CH_2CH_2$— or other examples of suitable divalent hydrocarbon ether radicals and halohydrocarbon ether radicals including —$CH_2CH_2OCH_2CH_2$—, —$C_6H_4$—O—$C_6H_4$—, —$CH_2CH_2CF_2OCF_2CH_2CH_2$—, and —$CH_2CH_2OCH_2CH_2$—.

Such polymers as component (A) containing R, $R^1$ and/or $R^9$ radicals are e.g. alkenyl-dimethylsiloxy or trimethylsiloxy terminated polydimethylsiloxanes, which can contain other siloxane units than alkenylmethylsiloxy groups dimethylsiloxy groups such as poly(dimethyl-co-diphenyl)siloxanes.

Broadly stated component (A) of the compositions of this invention can be any polyorganosiloxane compound containing two or more silicon atoms linked by oxygen and/or divalent groups $R^9$ wherein the silicon is bonded to 0 to 3 monovalent groups per silicon atom, with the proviso that the polyorganosiloxane compound contains at least two silicon-bonded unsaturated hydrocarbon residues.

The siloxane units with radicals R and/or $R^1$ can be equal or different for each silicon atom. In a preferred embodiment the structure is

  (1)

p=0-3, preferably 1,
m1=0-2000, preferably 10-1000,
n=0-500 preferably 0-200.

One preferred polyorganosiloxane component (A) for the composition of this invention is a substantially linear polyorganosiloxane (A1). The expression "substantially linear" includes polyorganosiloxanes (A1) that contain not more than 0.2 mol. % (trace amounts) of siloxy units of the type T or Q. This means the polymer (A) is preferably a linear, flowable fluid (A1):

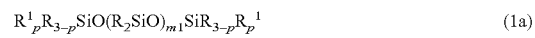  (1a)

wherein $R^1$, R, p and m1 are as defined above,
with the proviso, that there are at least two alkenyl groups per molecule.

Preferred structures include

  (1b)

  (1c),

In the group of alkenyl comprising siloxanes (A) the addition of a second or third siloxane as component (A2) and/or (A3) is preferred. The purpose of component (A2) and (A3) so-called vinyl rich polymers is to modify mechanical properties and crosslinking density.

The polymers (A2) are selected either from the group consisting of polymers of the formulas (1d) to (1i), i.e. linear polyorganosiloxanes having additional alkenyl side groups wherein the concentration of T- and Q-groups are below 0.2 mol. % or polyorganosiloxanes having a higher concentration of T- and Q-groups than the previous polymer types (A1) or (A2).

The polymers (A2) are represented by the formulas (6)

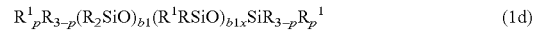  (1d)

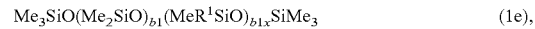  (1e),

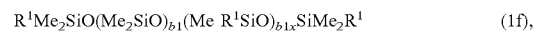  (1f), whereby
b1=>0-2000
b1x=0-500
b1+b1x=>10-100
$R^1$, R, p are as defined above,
$R^1$=preferably vinyl, hexenyl, cyclohexenyl, limonyl, styryl, vinylphenylethyl.

Preferred groups for R are methyl, phenyl, 3,3,3-trifluoropropyl.

The preferred value of b1x is less than 0.5*b1, preferably 0.0001*b1 to 0.25*b1 more preferably 0.0015*b1 to 0.2*b1.

Other preferred structures of (A2) are

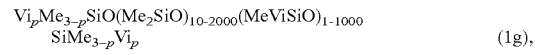  (1g),

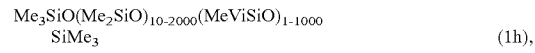  (1h),

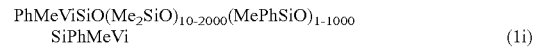  (1i)

and
wherein Me=methyl, Vi=vinyl, Ph=phenyl, and p=0 to 3, preferred p=1.

The third component of polymer (A), branched polymers (A3), are preferably selected from those of the formula (4a) wherein the polyorganosiloxane (A3) comprising alkenyl groups have more than 0.2 mol. % of T=$RSiO_{3/2}$ or Q=$SiO_{4/2}$— units.

  (4a)

whereby
M=$R_3SiO_{1/2}$, or M*
D=$R_2SiO_{2/2}$, or D*

T=RSiO$_{3/2}$, or T*
Q=SiO$_{4/2}$,
wherein M*, D* and T* are as defined above, carrying unsaturated groups R$^1$. The amount of such M*, D* and T* units is preferably 0.001 to 20 mol. %, more preferably 0.01 to 15 mol. %, most preferably 0.1 to 10 mol. % based on all siloxy units.

The range of the subindices defines a range of the possible average polymerization degrees P$_n$ according to the number average molecular weight M$_n$. The indices relate to suitable viscosities as defined lateron and describe polymers without any solvent for a viscosity adjustment.

The preferred branched polyorganosiloxanes (A2) and (A3) have usually a higher concentration of unsaturated groups R$^1$. Branched polymers (A3) are described e.g. in U.S. Pat. No. 5,109,095. Preferably the branched vinyl-rich polymers (A3) have a range of D:T>10:1 preferably >33:1 and/or respectively
(M:Q)=0.6-4:1, such as e.g. [M$_{0.7}$
M*$_{0.05}$Q]$_{10-500}$ (1j).

All these polymers can be prepared by any of the conventional methods for preparing triorganosiloxane-terminated polydiorganosiloxanes. For example, a proper ratio of the appropriate hydrolyzable silanes, e.g., vinyldimethylchlorosilane, trimethylchlorsilane, tetrachlorosilane, methyltrichlorsilane and dimethyldichlorosilane, or its corresponding alkoxysilanes, can be co-hydrolyzed and condensed. Other reaction routes may run alternately over equilibration reactions of 1,3-divinyltetraorganodisiloxane, e.g. symmetrical divinyldimethyldiphenylsiloxane or divinyltetramethylsiloxane, which furnishes the endgroups of the polydiorganosiloxane, which may be equilibrated with an appropriate polydiorganosiloxane, e.g., octamethylcyclotetrasiloxane, in the presence of an acidic or basic catalyst.

In a preferred embodiment the polymer component (A) is a mixture of polymers of the formula (1a) and/or of the formula (1d) and/or (1j) whereby the mixture has an alkenyl content in average of preferably below 2 mol. % of all siloxy units of the mixture (A), whereby polymer (A1) is present in a higher amount than (A2) or (A3).

The viscosities of the polydiorganosiloxanes (A) defined above for the purposes of this invention, refer preferably essentially free of cyclic polydiorganosiloxanes (less than 1 wt. %, preferably 0.5 wt. % measured for 1 h 150° C. 20 mbar) portion of the polyorganosiloxane.

The average polymerization degree P$_n$ of the siloxane units (M, D, T, Q) of the polymer (A) measured by GPC measurement versus polystyrene standard based on the average number mol weight M$_n$ is preferably in the range of P$_n$>10 to 2000, the more preferred range is 40 to 1000. The viscosities of such polymers are in the range of 10 to 100,000 mPa·s at 25° C. at a shear rate of D=1 s$^{-1}$, more preferred 40 to 50,000 mPa·s.

In a preferred embodiment polymer(s) (A) have a viscosity of more than 15,000 mPa·s at 25° C. at a shear rate of D=1 s$^{-1}$, in order to ensure a sufficiently high viscosity of the encapsulant composition, which is advantageous in sealing bigger seams.

The alkenyl content of the components (A) can be determined here by way of $^1$H NMR—see A. L. Smith (ed.): The Analytical Chemistry of Silicones, J. Wiley & Sons 1991 Vol. 112 pp. 356 et seq. in Chemical Analysis ed. by J. D. Winefordner.

Component (B)-Crosslinker

The component (B) is at least one polyorganohydrogensiloxane having at least seven Si atoms, wherein the molar ratio of SiH-groups to all Si-atoms is more than 0.55, preferably 0.6, still more preferably 0.7, particularly preferred 0.7 to 0.95. Suitable polyorganohydrogensiloxanes (B) comprising SiH units can be formally described by the general formula (2),

wherein the siloxy units
M$^1$=M, as defined above, or M**,
D$^1$=D, as defined above, or D**,
T$^1$=T, as defined above, or T**,
Q as defined above,
R$^9$ as defined above,
M=HR$_2$SiO$_{1/2}$, D=HRSiO$_{2/2}$, T**=HSiO$_{3/2}$,
a2=0.01-10 preferably=2-5, most preferably=2
b2=0-1000 preferably=10-500
c2=0-50 preferably=0
d2=0-1 preferably=0 or 1, most preferably=0
e2=0-3 preferably=0
m2=1-1000, preferably=1-500, most preferably=1,
with the proviso that in the general formula (2) at least seven Si atoms are present and that the molar ratio of SiH-groups (siloxy groups comprising SiH group) to all Si-atoms is more than 0.55. Preferably the component (B) is selected from polysiloxanes that have only methyl or phenyl groups as organic residues.

Preferably the polyorganohydrogensiloxanes (B) have at least 10, preferably at least 15, more preferably at least 20, still more preferably at least 25 and most preferably at least 30 silicon atoms.

The siloxy units can be distributed blockwise or randomly in the polymer chain.

The aforementioned indices should represent the average polymerization degree P$_n$ based on the average number molecular mass M$_n$.

The range for M-, D-, T- and Q-units present in the molecule can cover nearly all values representing fluids, flowable polymers, liquid and solid resins. It is preferred to use liquid linear, cyclic or branched siloxanes. Optionally these siloxanes can comprise additionally traces of C$_1$-C$_6$-alkoxy or Si-hydroxy groups remaining from the synthesis.

Preferred structures of component (B) in the compositions of this invention are siloxanes of formula (2a) to (2d).

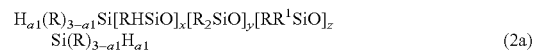

more specifically:

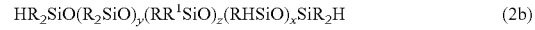

wherein R and R$^1$ are as defined above, R is preferably methyl and/or phenyl, R$^1$ is preferably vinyl, and index 'a1' is 0-1, preferably 0, and
x=2-1000, preferably=2-500,
y=0-650, preferably=0-100,
z=0-65, preferably=0-650,
7≤x+y+z<1000, preferably 10≤x+y+z<650,
wherein in each formula (2a)-(2d) the molar ratio of SiH-groups to all Si-atoms is more than 0.55.

Furthermore resinous polyorganohydrogensiloxanes of the following formula are possible:

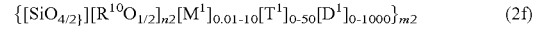

wherein
T$^1$, M$^1$, D$^1$ are as defined above,
n2=0 to 3
m2 is as defined above
R$^{10}$ is hydrogen, C$_1$-C$_{25}$-alkyl, such as methyl, ethyl, n-propyl, iso-propyl, n-, iso- and tert.-butyl, alkanoyl, such acyl, aryl, —N=CHR, such as butanonoxime, alkenyl, such as propenyl,
wherein in each formula (2e)-(2f) the molar ratio of SiH-groups to all Si-atoms is more than 0.55 and the total number of Si atoms is at least 7.

One preferred embodiment of the compounds (2f) is provided by way of example by monomeric to polymeric compounds which can be described via the formula [(Me$_2$HSiO$_{0.5}$)$_k$SiO$_{4/2}$]$_{1.5-1000}$ wherein index k is from 0.3 to 4. Such liquid or resinous molecules can contain significant concentrations of SiOH— and/or (C$_1$-C$_6$)-alkoxy-Si groups of up to 10 mol. % related to the silicon atoms.

Specific examples of preferred suitable compounds for component (B) in the compositions of this invention include
Me$_3$SiO—(MeHSiO)$_{5-650}$—SiMe$_3$,
(MeHSiO)$_7$,
HMe$_2$SiO(Me$_2$SiO)$_{0-300}$(MePhSiO)$_{0-300}$(MeHSiO)$_{1-650}$SiMe$_2$H,
Me$_3$SiO(Me$_2$SiO)$_{0-300}$(MePhSiO)$_{0-300}$(MeHSiO)$_{2-650}$SiMe$_3$,
Me$_3$SiO(Me$_2$SiO)$_{0-300}$(Ph$_2$SiO)$_{0-300}$(MeHSiO)$_{2-650}$SiMe$_3$,
wherein in each formula the molar ratio of SiH-groups to all Si-atoms is more than 0.55 and the total number of Si atoms is at least 7.

The component (B) can be used as a single component of one polyorganosiloxane polymer or mixtures thereof.

If an increase of the cure rate is required, it is preferred to use some organopolysiloxanes (B) having HMe$_2$SiO$_{0.5}$—units or homo MeHSiO-polymers to adjust the cure rate to shorter times.

If it is necessary to still further increase the cure rate, this can be achieved by way of example via an increase of the molar ratio of SiH to Si-alkenyl, or an increased amount of catalyst (C).

The component (B) has preferably a viscosity at 25° C. from 2 to 1000 mPa·s.

Preferably the crosslinker (B) should have at least more than 3, more preferably more than 15, still more preferably more than 20 and most preferably more than 25 SiH-groups per molecule.

The molar ratio of the total of SiH groups in component (B) to the total of the unsaturated hydrocarbyl residues R$^1$ in component (A) and if present in (B) in the formulation is between 0.7 and 4, preferably 1 to 4, more preferably 0.8 to 2.5, more preferably 1.0 to 2.1, still more preferably 1.2 to 2 in order to provide high-efficacy photovoltaic modules comprising the encapsulant according to the invention.

Component (B) does not include the component (D) or with other words is different from component (D).

Component (C)-Catalyst

The inventive composition contains at least one hydrosilylation catalyst as component (C) selected from the group of organo metal compounds, salts or metals, having the ability to catalyze hydrosilylation wherein the metal is selected from the group of Ni, Ir, Rh, Ru, Os, Pd and Pt compounds as taught in U.S. Pat. No. 3,159,601; U.S. Pat. No. 3,159,662; U.S. Pat. No. 3,419,593; U.S. Pat. No. 3,715,334; U.S. Pat. No. 3,775,452 and U.S. Pat. No. 3,814,730.

The component (C) for the hydrosilylation reaction of the inventive composition is a catalyst compound, which facilitates the reaction of the silicon-bonded hydrogen atoms of component (B) with the silicon-bonded olefinic hydrocarbon substituents of component (A). The metal or organo metal compound can be any catalytically active metal and is generally a platinum group metal-containing a catalytic active component. Without wishing to be bound by theory, it is believed that the catalyst (C) includes complexes with sigma- and pi-bonded carbon ligands as well as ligands with S-, N, or P atoms, metal colloids or salts of the afore mentioned metals. The catalyst can be present on a carrier such as silica gel or powdered charcoal, bearing the metal, or a compound or complex of that metal. Preferably, the metal of component (C) is any platinum complex compound.

A typical platinum containing catalyst component in the polyorganosiloxane compositions of this invention is any form of platinum (0), (II) or (IV) compounds which are able to form complexes with the inventive phosphites. Preferred complexes are Pt-$^{(0)}$-alkenyl complexes, such alkenyl, cycloalkenyl, alkenylsiloxane such vinylsiloxane, because of its easy dispersibility in polyorganosiloxane compositions.

A particularly useful form of the platinum complexes are the Pt$^{(0)}$-complexes with aliphatically unsaturated organo-silicon compound such as 1,3-divinyltetramethyldisiloxane (Vinyl-M2 or Karstedt catalyst), as disclosed by U.S. Pat. No. 3,419,593 incorporated herein by reference are especially preferred, cyclohexene-Pt, cyclooctadien-Pt and tetravinyltetramethyl-tetracyclosiloxane (Vinyl-D4).

Pt$^0$-olefin complexes are prepared by way of example in the presence of 1,3-divinyltetramethyldisiloxane (M$^{Vi}_2$) via reduction of hexachloroplatinic acid or of other platinum chlorides by the way of example by alcohols in the presence of basic compounds such as alkali carbonates or hydroxides.

The amount of platinum-containing catalyst component that is used in the compositions of this invention is not narrowly limited as long as there is a sufficient amount to accelerate the hydrosilylation between (A) and (B) at the desired temperature in the required time (B) in the presence of all other ingredients of the inventive composition. The exact necessary amount of said catalyst component will depend upon the particular catalyst, the amount of other inhibiting compounds and the SiH to olefin ratio and is not easily predictable. However, for platinum catalysts said amount can be as low as possible due to cost reasons. Preferably one should add more than one part by weight of platinum for every one million parts by weight of the organosilicon components (A) and (B) to ensure curing in the presence of other undefined inhibiting traces. For the compositions of this invention, which are to be used by the coating method of this invention the amount of platinum containing catalyst component to be applied is preferably sufficient to provide from 1 to 200 ppm preferably 2 to 100 ppm, especially preferred 4 to 60 ppm by weight platinum per weight of polyorganosiloxane components (A) plus (B).

Preferably said amount is at least 4 ppm by weight per sum of (A) and (B).

The hydrosilylation catalyst can also be selected from the group of catalysts capable of being photoactivated.

These photo-activatable catalysts preferably contain at least one metal selected from the group composed of Pt, Pd, Rh, Co, Ni, Ir or Ru. The catalysts capable of being photoactivated preferably comprise platinum compounds.

Catalyst capable of being photo-activatable is preferably selected among organometallic compounds, i.e. comprise carbon-containing ligands, or salts thereof. In a preferred embodiment photoactive catalyst (C) has metal carbon bonds, including sigma- and pi-bonds. Preferably the catalyst capable of being photo-activated (C) is an organometallic complex compound having at least one metal carbon sigma bond, still more preferably a platinum complex compound having preferably one or more sigma-bonded alkyl and/or aryl group, preferably alkyl group(s). Sigma-bonded ligands include in particular, sigma-bonded organic groups, preferably sigma-bonded $C_1$-$C_6$-alkyl, more preferably sigma-bonded methyl groups, sigma-bonded aryl groups, like phenyl, Si and O substituted sigma bonded alkyl or aryl groups, such as trisorganosilylalkyl groups, sigma-bonded silyl groups, like trialkyl silyl groups. Most preferred photo-activatable catalysts include $\eta^5$-(optionally substituted)-cyclopentadienyl platinum complex compounds having sigma-bonded ligands, preferably sigma-bonded alkyl ligands.

Further catalysts capable of being photoactivated include ($\eta$-diolefin)-(sigma-aryl)-platinum complexes (see e.g. U.S. Pat. No. 4,530,879).

The catalyst capable of being photoactivated can be used as such or supported on a carrier.

The catalysts capable of being photo-activated is a catalyst, which provides additional options to extend the bath-life time of the reactive silicon based composition in addition to the inventive phosphites and allows to enlarge the processing time prior to gelling of the components.

Examples of catalysts capable of being photo-activated include $\eta$-diolefin-$\sigma$-aryl-platinum complexes, such as disclosed in U.S. Pat. No. 4,530,879, EP 122008, EP 146307 (corresponding to U.S. Pat. No. 4,510,094 and the prior art documents cited therein), or US 2003/0199603, and also platinum compounds whose reactivity can be controlled by way for example using azodicarboxylic esters, as disclosed in U.S. Pat. No. 4,640,939 or diketonates.

Platinum compounds capable of being photo-activated that can be used are moreover those selected from the group having ligands selected from diketones, e.g. benzoylacetones or acetylenedicarboxylic esters, and platinum catalysts embedded into photo-degradable organic resins. Other Pt-catalysts are mentioned by way of example in U.S. Pat. No. 3,715,334 or U.S. Pat. No. 3,419,593, EP 1 672 031 A1 and Lewis, Colborn, Grade, Bryant, Sumpter, and Scott in Organometallics, 1995, 14, 2202-2213, all incorporated by reference here.

Catalysts capable of being photo-activated can also be formed in-situ in the silicone composition to be shaped, by using $Pt^0$-olefin complexes and adding appropriate photo-activatable ligands thereto.

The catalysts capable of being photo-activated that can be used here are, however, not restricted to these above-mentioned examples.

The most preferred catalyst capable of being photo-activated to be used in the process of the invention are ($\eta^5$-cyclopentadienyl)-trimethyl-platinum, ($\eta^5$-cyclopentadienyl)-triphenyl-platinum complexes, in particular, ($\eta^5$-methylcyclopentadienyl)-trimethyl-platinum.

The amount of the catalyst capable of being photo-activatable is preferably 1 to 500 ppm and preferably in the same lower range as defined for the heat-activatable hydrosilylation catalysts mentioned above.

As explained already above, the specific phosphites used in accordance with the invention interact with those conventional transition metal compounds through ligand exchange reactions, thereby influencing the hydrosilylation activity of the catalyst to provide surprisingly an excellent balance between storage stability on the one hand and reactivity at elevated temperatures upon curing.

Component (D):

The curable polyorganosiloxane composition optionally comprises at least one adhesion promoter (D).

Component (D) is preferably selected from at least one of
(D1): at least one organosiloxane, comprising at least one alkoxy silyl group,
(D2): at least one organosilane, comprising at least one alkoxy silyl group,
(D3): at least one aromatic organic compound having at least two aromatic moieties and at least one group reactive in hydrosilylation.

Component (D1) is preferably an polyorganosiloxane comprising at least one unit selected from the group consisting of
$RHSiO_{2/2}$ and
$R^5(R)SiO_{2/2}$,
wherein R is as defined above and may be identical or different, $R^5$ is selected from the group consisting of unsaturated aliphatic group with up to 14 carbon atoms, epoxy-group-containing aliphatic group with up to 14 carbon atoms, cyanurate-containing group, and an isocyanurate-containing group, and further comprising at least one unit of the formula (3):

$$O_{2/2}(R)Si-R^4-SiR_d(OR^3)_{3-d} \qquad (3)$$

wherein
R is as defined above and may be identical or different,
$R^3$ is selected from H (hydrogen) and alkyl radicals having 1 to 6 carbon atoms, and may be identical or different,
$R^4$ is a difunctional optionally substituted hydrocarbyl radical with up to 15 carbon atoms, which may contain one or more heteroatoms selected from O, N and S atoms, and which is bond to the silicon atoms via an Si—C-bond, and
d is 0 to 2.

Examples of component (D1) include compounds of the formulas (3a-3d):

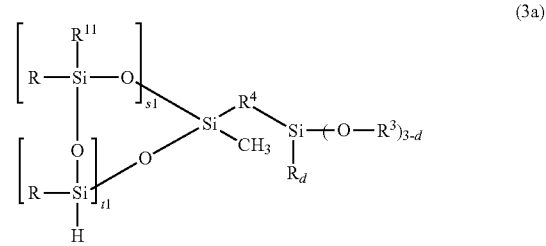

(3a)

$R^{11}$ is R or $R^5$, wherein R, $R^3$, $R^4$ and $R^5$ are as defined above and may be identical or different,
s1=0-6, preferably 1
t1=0-6, preferably 1 or 2
s1+t1=2-6, preferably 2 or 3
with the proviso that there is at least one group —(OSi(R)H)— or —(OSi(R)($R^{11}$))— in the compound, preferably a compound of the formula:

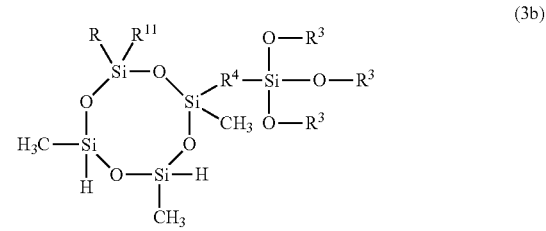

(3b)

wherein R, $R^3$, $R^4$ and $R^{11}$ are as defined before, and ring positions isomers thereof, a compound of the formula:

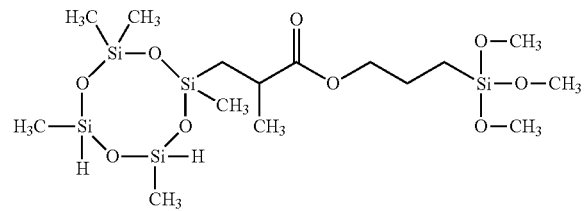
(3c)

and ring positions isomers thereof, a compound of the formula.

Furthermore compounds of formula:

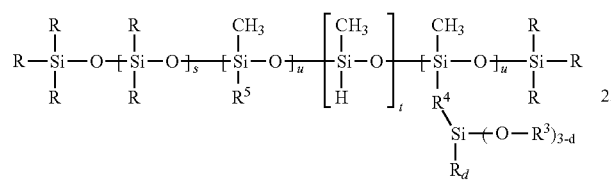
(3d)

wherein:
R, $R^3$, $R^4$, $R^5$ are as defined above,
s=0-10 preferably=0-5
t=0-50 preferably=2-30
u=1-10 preferably=1
s+t+u=≤70
with the proviso that there is at least one group —(OSi(R)H)— or —(OSi(R)($R^5$)— in the compound. These compounds may comprise to a certain content Q or T branching groups, replacing the D units.

$R^5$ is for example selected from:

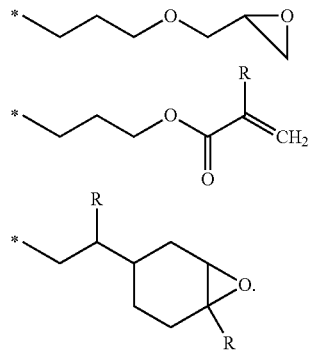

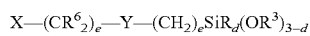

Component (D2) is preferably selected from compounds of the formula (4):

X—$(CR^6_2)_e$—Y—$(CH_2)_e SiR_d(OR^3)_{3-d}$ wherein
X is selected from the group consisting of halogen, pseudohalogen, unsaturated aliphatic group with up to 14 carbon atoms, epoxy-group-containing aliphatic group with up to 14 carbon atoms, cyanurate-containing group, and an isocyanurate-containing group, Y is selected from the group consisting of a single bond, a heteroatomic group selected from —COO—, —O—, —S—, —CONH—, —HN—CO—NH—,
$R^6$ is selected from hydrogen and R as defined above,
e is 0, 1, 2, 3, 4, 5, 6, 7, or 8, and may be identical or different,
R is as defined above and may be identical or different,
$R^3$ is as defined above and may be identical or different,
d is 0, 1, or 2.

Preferred examples of component (D2) include:

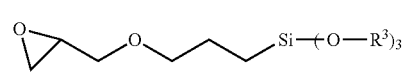
(3e)

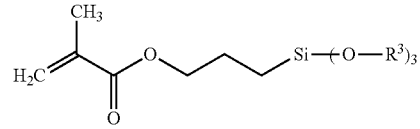
(3f)

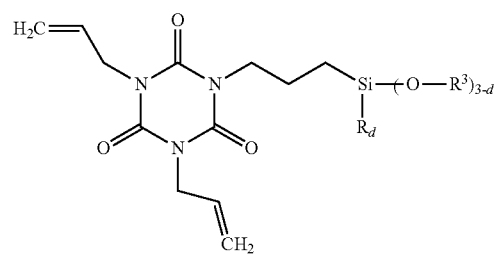
(3g)

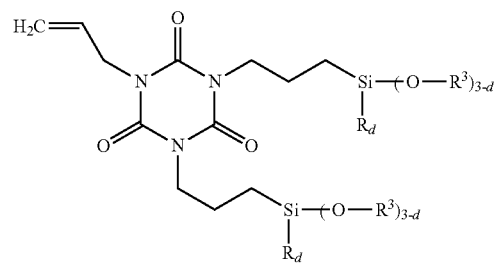
(3h)

wherein R and d are as defined above.

Component (D2) apart from acting as an adhesion promoter, can serve in addition as in-situ surface treating agent for filler (E). It is preferred to use mixtures of silanes of the component (D2) to obtain acceptable adhesion properties at reduced costs.

Component (D3) is preferably selected from compounds of the formula (3i):

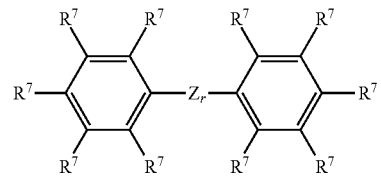
(3i)

wherein
r is 0 or 1,
$R^7$ may be the same or different group, which is selected from the group consisting of a hydrogen atom, a hydroxyl group, a halogen atom, an alkyl group, alkenyl group, alkoxy group, alkenyloxy group, alkenylcarbonyloxy group and an aryl group, and a group of formula $-E_f-Si(OR)_{3-d}R_d$, wherein R is identical or different, and d is as defined above, a group of formula $-O-Si(R)_2R^1$, wherein R and $R^1$ are as defined above, a group of formula $-E_f-Si(R)_2H$, wherein R is as defined above, wherein E is a divalent organic group with up to 8 carbon atoms and 0 to 3 hetero atomic groups selected from —O—, —NH—, C=O, and —C(=O)O—, and f is 0 or 1, and Z is selected from the following groups:

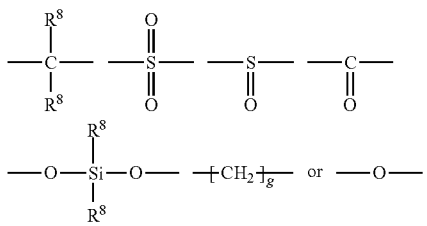

wherein $R^8$ is selected from the group of a hydrogen atom, a halogen atom, or a substituted or unsubstituted alkyl group, aryl group, alkenyl group and alkynyl group, and g is a positive number of at least 2, wherein at least one of the groups selected from $R^7$ and $R^8$ is reactive in hydrosilylation.

Preferred components (D3) include:

The fillers include by way of example all of the fine-particle fillers, i.e. those having particles smaller than 100 μm, i.e. preferably composed of such particles. These can be mineral fillers, such as silicates, carbonates, nitrides, oxides, or silicas. The fillers are preferably those known as reinforcing silicas, which permit production of elastomers having sufficient transparency for irradiation. Preferred are reinforcing silicas which improve properties of the cured encapsulants after crosslinking, in particular those increasing the strength. Examples are fumed or precipitated silicas whose BET surface areas are from 50 to 400 $m^2/g$. Preferably these fillers are surface-hydrophobicized. If component (E) is used, its amounts are from 1 to 100 parts by weight, preferably from 0 to 70 parts by weight, even more preferably from 0 to 50 parts by weight, even more preferably from 5 to 45 parts by weight based on 100 parts by weight of component (A) and (B).

Fillers whose BET surface areas are above 50 $m^2/g$ permit production of silicone elastomers with improved properties. In view of strength and transparency fumed silicas are preferred, and even more preferred silicas are, for example, Aerosil® 200, 300, HDK® N20 or T30, Cab-O-Sil® MS7 or HS5 having more than 200 $m^2/g$ BET surface area. As BET surface area rises, the transparency of the silicone mixtures in which these materials are present also rises. Examples of trade names of the materials known as precipitated silicas, or wet silicas, are Vulkasil®VN3, or FK 160 from Evonik (formerly Degussa), or Nipsil®LP from Nippon Silica K.K. and others.

It is preferred to use silica fillers having BET-surface areas of 50 $m^2/g$ or more, preferably having a BET-surface of at least 150 $m^2/g$. Such compositions can be photoactivated if desired due to sufficient transparency.

(3j)
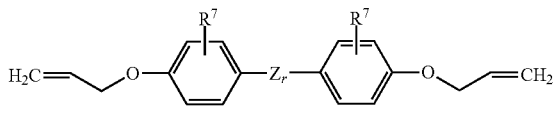

(3k)
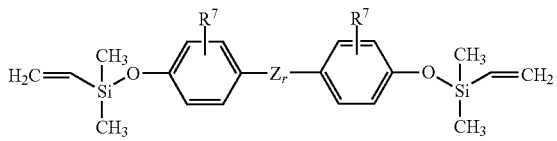

(3l)
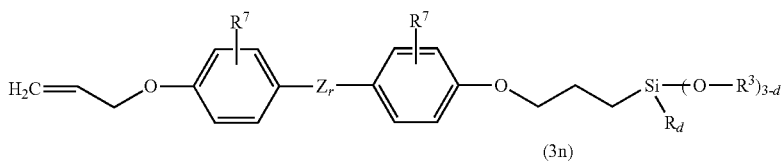

(3n)
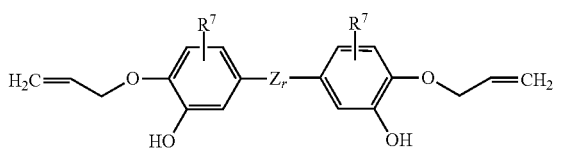

(3m)

wherein $Z_r$, $R^7$, $R^3$, R and d are each as defined above.

Component (E) Reinforcing Filler

The curable polyorganosiloxane compositions for the use as an encapsulant optionally comprise one or more, if appropriate surface-modified, reinforcing filler (E). Reinforcing fillers (E) are characterized by a BET surface area of 50 $m^2/g$ or more.

In general, if curable polyorganosiloxane compositions are irradiation-cured such fillers should be transparent and allow or high light-transmittance.

The fillers (E) may be subject of any suitable conventional surface-treatment with suitable surface-treatment agents belonging to hydrophobizing treatment with a suitable hydrophobizing agent, dispersing treatment with suitable dispersing agents which influence the interaction of the filler with the silicone polymer, e.g. influence thickening action. The surface treatment of the fillers is preferably a hydrophobation with silanes or with siloxanes. It can by way of example take place in situ via addition of silazanes, such as hexamethyldisilazane and/or 1,3-divinyltetramethyldisilazane, with addition of water, and 'in-situ'-hydrophobation is preferred. It can also take place with other filler-treatment agents with polyorganosiloxanediols whose chain lengths are from 2 to 50 and which bear unsaturated organic radicals, with the aim of providing reactive sites for the crosslinking reaction.

Examples of commercially available silicas pre-hydrophobized with various silanes are: Aerosil R 972, R 974, R 976, or R 812, or, for example, HDK 2000 or H30 Examples of trade names for materials known as hydrophobized precipitated silicas or wet silicas are e.g. Sipernat D10 or D15 from Evonik (formerly Degussa). Rheological properties, i.e. technical processing properties, of the non-cured silicone rubber mixtures can be influenced by the selection the amount of the type of the filler, its amount, and the nature of hydrophobation.

Conventional Auxiliary Additives

The curable polyorganosiloxane composition for the use as an encapsulant according to the invention may also comprise conventional auxiliary additives.

Such auxiliary or conventional additives can comprise stabilizers against hot air, oils and solvents, process aids, mould release agents, wettings agents, pigments, functional fillers for increased heat or electrical conductivity, low surface or inert fillers so-called extenders for extended volume, solvents, natural or synthetic fibers for reinforcement, blowing agents to initiate foaming, anti-microbial, fungicides or additive for increasing mildew resistance.

Examples of materials serving as fillers or extenders (BET-surface areas <50 $m^2$/g) are known as non-reinforcing fillers. They include for example powdered quartz, diatomaceous earths, powdered crystoballites, micas, aluminum oxides, and aluminum hydroxides. Titanium dioxides or iron oxides, Zn oxides, chalks, or carbon blacks whose BET surface areas are from 0.2 to less than 50 $m^2$/g can be used also as heat stabilizer. These fillers are available under variety of trade names, examples being Sicron®, Min-U-Sil®, Dicalite®, Crystallite®. The materials known as inert fillers or extenders with BET surface areas below 50 $m^2$/g should advantageously comprise no particles (<0.005% by weight) above 100 μm for use in silicone rubbers, in order that further processing generates no problems during downstream processing, e.g. passage through sieves or nozzles, or the mechanical properties of the articles produced therefrom are adversely affected. Among the opacifying fillers are also in particular non-transparent, in particular inorganic, pigments or carbon black.

The use of these opacifying fillers is preferred only when pigmentation is necessary or the physical function like thermal or electrical conductivity is a requirement.

The use of opaque non-transparent fillers requires changing the usual sequence of the activation and shaping steps in the process. Normally, if no or transparent fillers are used, the photo-activation through irradiation is carried out after the final shaping process. If opaque non-transparent fillers, which would inhibit the photo-activation of the photo-activatable catalyst, are used, the photo-activation step is carried out before the opaque non-transparent fillers are incorporated and the mixture is shaped.

As the person skilled in the art knows, filler can also be a pigment, e.g. organic dyes or pigments or inorganic pigments.

The auxiliary or conventional additives further include e.g. plasticizers, or release oils, or hydrophobicizing oils, such as polydimethylsiloxane oils having a viscosity which is preferably 0.001-10 Pa·s at 25° C. Additional mould-release or flow improving agents can also be used, examples being fatty acid derivatives or fatty alcohol derivatives, fluoroalkyl surfactants. Compounds advantageously used here are those, which separate rapidly and migrate to the surfaces. Stability after exposure to hot air can by way of example be increased using known hot-air stabilizers, such as Fe-, Mn-, Ti-, Ce- or La-compounds, and organic salts of these, preferably their organic complexes. The auxiliary additives may also include so-called inhibitors for controlling the crosslinking reaction. However the presence of those inhibitors is in general not preferred. However, if it is intended to extent the pot-life of the silicone composition to be shaped, for example, in case non-transparent fillers are to be compounded after photo-activation, the use of such inhibitors may be suitable to decrease the cure rate. Examples of advantageous inhibitors include for example vinylsiloxanes, 1,3-divinyltetramethyldisiloxane, or tetravinyl-tetramethyl-tetracyclosiloxanes. It is also possible to use other known inhibitors, for example ethynylcyclohexanol, 3-methylbutynol, or dimethylmaleate.

The composition of the present invention can be prepared by homogeneously mixing components (A)-(E) using suitable mixing means, such as spatula, a drum roller, a mechanical stirrer, a three roll mill, a sigma blade mixer, a dough mixer, a planetary mixer, screws, dissolver, butterfly mixer, press mixer, or a vacuum mixer. The order of mixing components (A)-(E) is not critical, however, it is preferred that certain components can be mixed to form two or more packages which can be stored, if desired, and then mixed in a final step immediately prior to the intended use thereof.

It is preferred to mix component (C) and a portion of the components (A), (D) and (E) to provide a first package. Separately, components (A), (B), (D), (E) are mixed to provide a second package. These two packages can then be stored and then homogeneously mixed before use. Other combinations are also possible but it is important to keep the components (B) and (C) apart.

The curable polyorganosiloxane composition for the use as an encapsulant according to the invention preferably comprises:

100 parts by weight of component (A), 0.1 to 200 parts per weight of component (B), preferably 0.5 to 50 parts by weight, 0.5 to 1000, preferably 1 to 100 ppm of component (C) based on the amount of the transition metal and based on the total of components (A) and (B), 0.01 to 5, preferably 0.1 to 5, more preferably from 0.5 to 3 parts by weight of component (D), 0 to 50 parts by weight of component (E), preferably of 0 to 40 parts by weight, and optionally 0 to 15 parts, preferably from 0 to 6 parts by weight of the auxiliaries.

The amounts of components (A) and (B) is usually selected in such a manner, that the molar ratio of the total of SiH groups in component (B) to the total of the unsaturated hydrocarbyl residues in component (A) in the formulation is between 0.7 and 4, preferably 0.7 to 2.4; more preferably 0.7 to 2.

A further particularly preferred embodiment of the invention relates to a light-activatable, curable polyorganosiloxane composition, said composition comprising:

(A) at least one polyorganosiloxane having at least two unsaturated hydrocarbyl residues, (B) at least one polyorganohydrogensiloxane having at least seven Si atoms, wherein the molar ratio of SiH-groups to all Si-atoms is more than 0.35, (C) at least one light-activatable catalyst, (D) optionally at least one adhesion promoter selected from:
  (D1): at least one organosiloxane, comprising at least one alkoxy silyl group, and
  (D3): at least one aromatic organic compound having at least two aromatic moieties and at least one group reactive in hydrosilylation.

(E) optionally at least one reinforcing filler.

With respect to such new composition the same definitions apply as explained above, except for that the component (C), i.e. the hydrosilylation catalyst, is selected form light activatable catalysts or photoactivatable catalysts (both terms are used synonymously), which are explained in detail above.

Such light-activatable compositions are particularly preferred because they do not require heat-curing at elevated temperatures thereby reducing thermal stress to the solar cell modules in particular to the photovoltaic modules. Furthermore these compositions can be cure "on command", without potting times or shelf life times.

The addition-curable encapsulant of the present invention can be applied onto the surface of the relevant substrates of the solar modules by any suitable means such as rolling, spreading, spraying, calandering and the like and cured at a suitable temperature. The curing temperature and the time needed will depend upon the specific choice of the catalyst and inhibitor system.

The addition-curable encapsulant composition comprising the components (A) to (E) and the auxiliaries of the present invention has preferably a viscosity of 200 to 100000 mPa·s preferably 2500 to 80000 mPa·s, most preferably 10500 to 70000 mPa·s at 25° C. and at a shear rate of $D=10 \text{ s}^{-1}$.

Preferably the encapsulants are cured between 50 and 120° C. over a period of between 5 and 30 minutes. Other embodiments comprise the use of photo-activatable curable polyorganosiloxane compositions using photo-activatable catalysts or initiators. Curing is then initiated by irradiation with light, in particular UV light having a wavelength maximum between 300 and 550 nm. Irradiation curing is performed preferably at room temperature (25° C.).

Preferably the encapsulant is applied in a dry thickness of about 150 to 2000 μm, more preferably of about 200 to 600 μm.

The cured encapsulant according to the present invention preferably has a transparency of more than 80% more preferably more than 90% transmission measured at a thickness of 2 mm with a photometer at a wave length of 400 nm.

Numerous designs for photovoltaic modules have been published.

A usual solar cell module in accordance with the present invention may consist of a front glass superstrate, semiconductor cells (wafer or thin film), conductive lines, a substrate or backskin, and encapsulants that may partly or completely encapsulate the semiconductor cells. Encapsulation does not necessarily mean a fixed contact between the silicone encapsulant and the semiconductor cells as long as it fulfills the function of protecting the semiconductor cells. Preferably the solar cell module in accordance with the present invention does not contain an EVA sheet anymore between the glass superstrate and the semiconductor cells.

In addition the solar cell module in accordance with the present invention may comprise support frame, preferably made from metal, e.g. aluminum.

In a preferred embodiment of the present invention the cured silicone encapsulant together with the glass superstrate forms a closed space comprising the semiconductor cells. This embodiment may either include that the semiconductor cells are completely embedded in the cured silicone encapsulant that is in contact with the glass superstrate, or include that the cured silicone encapsulant and the glass superstrate, comprising the semiconductor cells, form an interspace. In a further preferred embodiment, the interspace formed by the cured silicone encapsulant and the glass superstrate does not comprise any other material than the semiconductor cells and the conductive lines.

In a further preferred embodiment the solar cell module in accordance with the present invention has an outer backskin that has preferably a high glass transition temperature, such as more than 120° C. The backskin substrate is a rigid or stiff backskin to provide protection to the rear surface of the module. A wide variety of materials have been proposed for such a substrate, which does not necessarily need to be transparent to light. They include materials such as organic fluoropolymers such as ethylene tetrafluoroethylene (ETFE), Tedlar, or polyethylene terephthalate (PET) alone or coated with silicon and oxygen based materials (SiOx), PVDF (polyvinylidene fluoride), PVF (polyvinylfluoride), multilayer materials like PVF-PET-PVF, or EVA copolymers although less preferred due to lower degradation resistance.

The outer backskin layer as described before is preferably in contact with the cured silicone encapsulant of the present invention. As explained above the cured silicone encapsulant at the same time provides excellent and durable adhesion to a glass superstrate and a backskin layer of a solar cell module, in particular a fluoro thermoplast sheet as backskin layer.

The curable polyorganosiloxane composition is preferably used as an encapsulant which is in contact with glass.

The present invention is further related to a process for the manufacture of photovoltaic solar cell modules, which process includes a step of applying the curable polyorganosiloxane composition onto at least one substrate which is comprised by the photovoltaic solar cell module, and curing the polyorganosiloxane composition so as to provide encapsulation of such substrate of the photovoltaic solar cell module. Preferably the polyorganosiloxane composition is applied between the glass superstrate and the semiconductor cell of the photovoltaic solar cell module thereby filling the gap between the glass superstrate and the semiconductor cell. The surface of the semiconducter cell carries the semiconductor material (in particular, silicon) and optionally conducting lines, so that the encapsulant is in direct contact with the semiconductor material (in particular, silicon) and optionally conducting lines and the glass superstrate in this embodiment.

The semiconducter cells of the photovoltaic solar cell module may have conducting lines towards the light-receiving side and/or the opposite side.

The present invention comprises the preferred embodiment, where the encapsulant covers only the backside of the semiconducter cells of the photovoltaic solar cell module (meaning the side opposite to the light-receiving side). This embodiment includes the possibility that the encapsulant is connected with the glass superstrate thereby forming a interstice between the semiconducter cells and the glass superstrate.

The present invention comprises further the preferred embodiment, where the encapsulant covers completely the semiconducter cells of the photovoltaic solar cell module. Also this embodiment includes the possibility that the encapsulant is connected with the glass superstrate thereby forming an interlocking layer between the glass superstrate and the semiconducter cells.

The process of manufacturing the solar cell module of the invention can be carried out continuously or discontinuously (batchwise), preferably continuously.

The type of glass that is used for making the solar cell glass superstrate and that is particular useful for adhesion to the cured silicone encapsulant of the invention, includes rolled glass, float glass. As these types of glass used in solar cell production usually have an inorganic or organic protective coating, the cured silicone encapsulant of the invention requires excellent adhesion properties also towards such protective coatings. Protective glass coatings may include inorganic protective coatings, such as metal oxide coatings, such as silicon oxide based coatings, titanium oxide based coatings, organic protective coatings such as fluoro resin coatings. A particular function of the glass protective coatings is to prevent leaching making the glass turbid or opaque.

The present invention is explained in more detail in the following examples.

EXAMPLES

Test Procedures

Test Procedure for Adhesion on Glass

The test method follows essentially ASTM C 794-06. Standard float glass plates 50 mm×150 mm with 2 mm thickness were used for the adhesion tests if not indicated otherwise. The glass plates were cleaned with 2-propanol and air-dried. A micromesh steel wire grid (Rocholl GmbH; 25 mm wide and 300 mm long; wire thickness: 0.5 mm; mesh width 1 mm×1 mm) was used for the preparation of the specimens.

Procedure: The glass plate is coated 4 mm thick with the silicone encapsulant. The grid is pressed into the coating and a second layer of the silicone encapsulant is applied on top. The grid overlaps on one side. Silicone encapsulant outside the grid is wiped off. The specimens are placed in an oven for 10 minutes, which has been pre-heated to 90° C. The specimens are stored under ambient conditions for at least 12 hours before they are tested. For adhesion testing the silicone is cut away from the glass by means of a scalpel 2 to 3 mm deep at the side of the specimen where the grid overlaps. The specimens are vertically clamped into a tensile testing machine. The free end of the grid is clamped into a suitable clamp of the load cells. The grid is pulled with 50 mm/minute forming an angle of 180° with the glass plate.

In the case of pure cohesive failure within the silicone adhesion was rated positive. In the case of initial adhesion the specimen was subjected to accelerated ageing and retested after different time spans. For accelerated ageing under heat and moisture the specimens were placed in a climate chamber at 85° C. and 85% relative humidity. The above adhesion test was repeated after 1000 hours. Three samples were tested for each material if not mentioned otherwise.

Test Procedure for Adhesion on Plastic

Tedlar® foil was used as a representative example for a plastic backskin of a solar module. The test specimens were prepared and tested similarly as described above for glass. The metal grid was replaced by foil. The glass plate is coated 4 mm thick with the silicone encapsulant then the foil is well pressed onto the coating. Silicone paste outside the foil is wiped off. For the accelerated ageing tests the specimens were subjected to 85° C. and 85% relative humidity for 1000 hours.

Preparation of the Encapsulants

The encapsulants were prepared in plastic beakers with a kitchen mixer. The filler batch was carefully diluted with the polyorganosiloxane having at least two alkenyl groups and then the other ingredients were added. The mixtures were de-aerated under vacuum before use.

Preparation of Filler Batch (F 1)

A filler batch (F 1) was produced as follows: 22.5 kg of a vinyl terminated linear polydimethylsiloxane with a viscosity of 10 Pa·s at 25° C. was placed in a planetary mixer and mixed with 2.8 kg of hexamethyldisilazane and 0.9 kg of water. 12.0 kg of fumed silica with a BET surface of 300 $m^2$/g were gradually added and mixed in until a stiff mixture was obtained. This mixture was stirred and heated to reflux for 30 minutes. The volatiles were distilled off and subsequently vacuum was pulled for 30 minutes. The mixture was diluted with 7.8 kg of the above polydimethylsiloxane. When the resulting filler batch was used for the preparation of the following encapsulants it was calculated as having 28.3% of silica and 71.7% of vinyl terminated polymer with a viscosity of 10 Pa·s.

EXAMPLE 1

Encapsulants with Different Crosslinkers 52 g of filler batch (F 1) were mixed with the amount of the different crosslinker components (B) in g as listed in the tables 1 in %, 0.12 g of a platinum solution of the Karstedt type with 1% of platinum, 10.5 µl of inhibitor ethinylcyclohexanol-(1) (ECH) and then the mixture was completed up to 100 g with ca. 46.5-47.5 g of a vinyl terminated linear polydimethylsiloxane having a viscosity of 10 Pa·s.

All examples 1.1-1.4 contained ca. 14.7 wt. % of filler, 12 ppm of platinum and 100 ppm of inhibitor ECH. The materials had a liquid to pasty, slightly sagging consistency.

TABLE 1

| | Type of crosslinker | mol. ratio SiH/all Si | Crosslinker [%] | SiH/SiVi | Initial adhesion on glass | Adhesion after 1000 h 85/85 |
|---|---|---|---|---|---|---|
| 1.1 | $M_2D^H_{52}$ | 0.96 | 0.38 | 1.38 | Yes | Yes |
| 1.2 | $M_2D^H_{26}D^{Ph}_{5.5}D_2$ | 0.73 | 0.75 | 1.38 | Yes | Yes |
| 1.3* | $M_2D^H_{12}D_{28}$ | 0.29 | 1.39 | 1.38 | No | No |
| 1.4* | $M_2D^H_{25}D_{25}$ | 0.48 | 0.83 | 1.38 | No | No |

*comparative examples

The comparative examples 1.3 and 1.4 demonstrate that the linear crosslinkers outside the inventive range of the SiH ratio do not adhere to glass not even under the test conditions of the initial phase, whereas the examples 1.1 and 1.2 adhere well in the fresh state and even after the accelerated ageing for 1000 hours at 85° C. and 85% relative humidity. The encapsulants 1.1 and 1.2 were also tested on Tedlar® foil (PVF) and failed adhesively after 1000 hours at 85° C. and 85% relative humidity. This observation indicates that composition without further adhesion promoters cannot completely deliver adhesion both to glass and to plastics such as PVF of the backskin as required.

EXAMPLE 2

Encapsulants with Different Crosslinkers and the Adhesion Promoter (D1)

The composition in this example uses an additional siloxane adhesion promoter (D1), which in this example is an addition product of methacryloxypropyltrimethoxysilane and $D^H_3D$ in a 1:1 molar ratio according to formula (3c).

52 g of filler batch (F 1) were mixed with the amount of the different crosslinker components (B) in g as listed in the tables 2 in %, 0.12 g of a platinum solution of the Karstedt type with 1% of platinum, 10.5 µl of inhibitor ethinylcyclohexanol-(1) (ECH), 0.7 g of adhesion promoter (D1) and then the mixture was completed up to 100 g with ca. 44.7-46.8 g of a vinyl terminated linear polydimethylsiloxane having a viscosity of 10 Pa·s.

All examples 2.1 to 2.10 contained ca. 14.7 wt. % of filler, 12 ppm of platinum and 100 ppm of inhibitor ECH and 0.7 g of adhesion promoter (D1). The materials had a liquid to pasty, slightly sagging consistency.

In addition the adhesion to a Tedlar® foil (PVF) was tested with the example 2.6. The encapsulant adhered in the initial test and survived 1000 hours at 85° C. and 85% relative humidity without any loss of adhesion to the foil.

EXAMPLE 3

Encapsulants with Different Crosslinkers and Adhesion Promoters

In the examples 3 the adhesion promoter component (D2) the siloxane of examples 2 and silanes as component (D2) are combined:

TABLE 2

|   | Type of crosslinker | mol. ratio SiH/all Si | Crosslinker [%] | SiH/SiVi | Initial adhesion | Adhesion after 1000 h 85/85 |
|---|---|---|---|---|---|---|
| 2.1 | $M_2D^H_{33}$ | 0.94 | 0.38 | 2.0 | Yes | Yes |
| 2.2 | $M_2D^H_{32}D_5$ | 0.82 | 0.50 | 2.0 | Yes | Yes |
| 2.3 | $M_2D^H_{27}D_7$ | 0.75 | 0.52 | 2.0 | Yes | Yes |
| 2.4 | $M_2D^H_{26}D_9$ | 0.70 | 0.56 | 2.0 | Yes | Yes |
| 2.5 | $M_2D^H_{26}D^{Ph}_{5.5}D_2$ | 0.73 | 0.74 | 2.0 | Yes | Yes |
| 2.6 | $M_2D^H_{33}D^{Ph}_{2.9}D_{5.3}$ | 0.76 | 0.56 | 2.0 | Yes | Yes |
| 2.7* | $M_2D^H_7D_4$ | 0.54 | 0.72 | 2.0 | Yes | No |
| 2.8* | $M_2D^H_{25}D_{25}$ | 0.48 | 0.82 | 2.0 | Yes | No |
| 2.9* | $M_2D^H_{12}D_{28}$ | 0.29 | 1.38 | 2.0 | Yes | No |
| 2.10* | $M_2D^H_{20}D_{105}$ | 0.16 | 2.55 | 2.0 | Yes | No |

*Comparative examples

The comparative examples 2.7 to 2.10 wherein the crosslinker structure is outside of the inventive range but with the adhesion promoting siloxane (D1) adhered well to glass in the initial state. However, all samples failed after 1000 hours at 85° C. and 85% humidity, although the samples of example 2.7-2.10 survived 250 hours at 85° C. and 85% relative humidity.

The samples of example 2.1 to 2.6 comprising a component (B) according to the definition of the inventive passed the test of 1000 hours at 85° C. and 85% relative humidity without adhesive failure in this peel adhesion test.

Memo=Methacryloxypropyltrimethoxysilane, $CH_2=C(CH_3)COO(CH_2)_3Si(OCH_3)_3$

Glymo=Glycidoxypropyltrimethoxysilane, $(C_2H_3O)CH_2O(CH_2)_3Si(OCH_3)_3$

Encapsulants were prepared as described in the examples 1 and 2 having incurporated ca. 14.7% of filler, the vinyl terminated polysiloxane with a viscosity of 10 Pa·s, 12 ppm of platinum, 100 ppm of ECH and the amounts of crosslinkers and adhesion promoters as listed in table 3.

TABLE 3

|   | Crosslinker | | | Adhesion promoter | | SiH/SiVi | Adhesion after 1000 hours 85° C. 85% rel. humidity |
|---|---|---|---|---|---|---|---|
|   |   | mol. ratio SiH/all Si | [%] |   | [%] |   |   |
| 3.1 | $M_2D^H_{33}$ | 0.94 | 0.64 | (B) | 1.0 | 1.9 | Yes |
|   |   |   |   | Glymo | 0.9 |   |   |
|   |   |   |   | Memo | 0.75 |   |   |
| 3.2 | $M_2D^H_{27}D_7$ | 0.75 | 0.87 | (B) | 1.0 | 1.9 | Yes |
|   |   |   |   | Glymo | 0.9 |   |   |
|   |   |   |   | Memo | 0.75 |   |   |
| 3.3 | $M_2D^H_{26}D_9$ | 0.70 | 0.93 | (B) | 1.0 | 1.9 | Yes |
|   |   |   |   | Glymo | 0.9 |   |   |
|   |   |   |   | Memo | 0.75 |   |   |
| 3.4 | $M_2D^H_{33}D^{Ph}_{2.9}D_{5.3}$ | 0.76 | 0.93 | (B) | 1.0 | 1.9 | Yes |
|   |   |   |   | Glymo | 0.9 |   |   |
|   |   |   |   | Memo | 0.75 |   |   |
| 3.5* | $M_2D^M_{25}D_{25}$ | 0.48 | 1.37 | (B) | 1.0 | 1.9 | No |
|   |   |   |   | Glymo | 0.9 |   |   |
|   |   |   |   | Memo | 0.75 |   |   |
| 3.5 | $M_2D^H_{33}$ | 0.94 | 0.55 | Glymo | 0.7 | 2.0 | Yes |
| 3.7* | $M_2D^H_{12}D_{28}$ | 0.29 | 2 | Glymo | 0.7 | 2.0 | No |
| 3.8 | $M_2D^H_{33}$ | 0.94 | 0.53 | Memo | 0.3 | 1.5 | Yes |
| 3.9 | $M_2D^H_{33}D^{Ph}_{2.9}D_{5.3}$ | 0.76 | 1.07 | Memo | 0.35 | 2.0 | Yes |

*Comparative examples

The examples 3.1 to 3.4 show sufficient adhesion under the 1000 h test conditions if 2 or 1, i.e. if at least the adhesion promoters of (D2) are present, whereas e.g. example 3.5 having a component (B) with a molar ratio of SiH of less than 0.5 shows insufficient adhesion over 1000 h at 85° C. and 85% humidity.

Example 3.4 e.g. shows in addition also good adhesion to Tedlar® foil i.e. Polyvinylfluorid (PVF DuPont) over 1000 h. The encapsulant adhered in the initial test and passed the 1000 hours at 85° C. and 85% relative humidity without any loss of adhesion to the PVF-foil.

EXAMPLE 4

Encapsulants with a Light Activatable Metal Catalyst 52 g vinyl-terminated polydimethylsiloxane polymer having a viscosity of 10 Pa·s at 25° C. as component (A) was admixed with 29 g of hexamethyldisilazane treated Aerosil 300 obtained according to the process of preparation of filler batch (F 1). Then to the resulting mixture further 16.7 g of the vinyl-terminated polydimethylsiloxane having a viscosity of 10 Pa·s was added. Then 0.9 g Dynasilan GLYMO (Glycidoxypropyltrimethoxysilane), 0.25 g Dynasilan MEMO (Methacryloxypropyltrimethoxysilane) as components (D2), 1 g of an adhesion promoter (D1) according to formula 3c, 0.9 g of a trimethylsilyl-terminated poly(co-diphenyl-methylhydrogendimethylsiloxane) $M_2D^{Ph}{}_2D^H{}_{25}D_4$ as component (B) were added. In a sealed darkened glove box under red or yellow light of a bulb lamp (excluding at least blue and UV-light) the light activatable metal catalyst which was trimethyl(methylcyclopentadienyl)-platium(IV) dissolved in a vinylterminated polydimethylsiloxane of 1 Pa·s at 25° C. was admixed using 10 g of this component as to establish a platinum concentration of 24 ppm Pt in the total composition of this example. The ratio of the $D^H$ units to all Si units in component (B) was 0.76, the SiH:Si-vinyl ratio in this example was 1.9.

The composition was irradiated for 10 sec at 120 mW/cm² (=1200 mJ/cm²) at a distance of 5 cm with a UV lamp Panacol UV-H255 type LH365E 250 W 320-405 nm as light source.

The cured composition adheres with a peel force of 10-12 N/mm and cohesive failure upon sheets of PVC (polyvinylchloride), PA 6.6 (polyamide), PBT (polybutylenterephtalat) after a storage of 7d at 25° C.

The cured composition adheres with a peel force of 8 N/mm after a storage of 90 min at 25° C. upon glass.

Peel forces were measured by the test method mentioned above (ASTM C 794-06).

Example 4 demonstrates that also light-activatable compositions using the adhesion promotors (D1) adhere to various substrates.

The invention claimed is:
1. A curable polyorganosiloxane composition for the use as an encapsulant, said composition consisting of:
(A) at least one polyorganosiloxane having at least two unsaturated hydrocarbyl residues,
(B) at least one polyorganohydrogensiloxane having at least seven Si atoms, wherein the molar ratio of SiH-groups to all Si-atoms in the polyorganohydrogensiloxane is ≥0.7,
(C) at least one hydrosilylation catalyst,
adhesion promoter (D1), wherein (D1) is a compound of formula (3c):

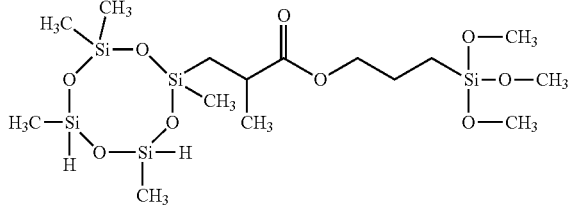

(3c)

and ring position isomers thereof, and
and
adhesion promoter (D2), wherein (D2) is at least one organosilane, comprising at least one alkoxy silyl group, selected from compounds of the formula (4):

$$X—(CR^6{}_2)_e—Y—(CH_2)_eSiR_d(OR^3)_{3-d} \quad (4)$$

wherein
X is selected from the group consisting of halogen, unsaturated aliphatic group with up to 14 carbon atoms, epoxy-group-containing aliphatic group with up to 14 carbon atoms, cyanurate-containing group, and an isocyanurate-containing group,
Y is selected from the group consisting of a single bond, a heteroatomic group selected from —COO—, —O—, —S—, —CONH—, —HN—CO—NH—,
e is 0, 1, 2, 3, 4, 5, 6, 7, or 8, and may be identical or different,
R may be the same or different, and is selected from optionally substituted alkyl with up to 30 carbon atoms, optionally substituted aryl with up to 30 carbon atoms, poly(C₂-C₄)-alkylene ether with up to 1000 alkylene oxy units, the groups R being free of aliphatic unsaturation,
$R^3$ is selected from H (hydrogen) and alkyl radicals having 1 to 6 carbon atoms, and may be identical or different,
$R^6$ is selected from hydrogen and R,
d is 0, 1, or 2,
(E) at least one reinforcing filler,
and optionally auxiliary or conventional additives selected from the group consisting of stabilizers against hot air, oils, solvents, process aids, mold release agents, wetting agents, pigments, functional fillers for increased heat or electrical conductivity, low surface or inert fillers, extenders for extended volume, natural or synthetic fibers, blowing agents, anti-microbial agents, fungicides, additives for increasing mildew resistance, opaque non-transparent fillers, plasticizers, release oils, hydrophobicizing oils, and inhibitors for controlling the crosslinking reaction,
wherein the molar ratio of the total of SiH groups in component (B) to the total of the unsaturated hydrocarbyl residues in component (A) in the formulation is between 0.7 and 4.

2. The curable polyorganosiloxane composition according to claim 1, wherein the encapsulant is for a photovoltaic module.

3. The curable polyorganosiloxane composition according to claim 1, wherein component (A) is a compound of formula (1):

$$R^1{}_aR_{3-a}SiO[R_2SiO]_m[R^1RSiO]_nSiR^1{}_aR_{3-a} \quad (1)$$

wherein R is selected from optionally substituted alkyl with up to 30 carbon atoms, optionally substituted aryl with up to 30 carbon atoms, or poly($C_2$-$C_4$)-alkylene ether with up to 1000 alkylene oxy units, the groups R being free of aliphatic unsaturation, wherein $R^1$ is selected from aliphatic or aromatic groups with up to 30 carbon atoms, comprising C=C-group-containing groups (alkenyl groups) or C≡C-group-containing groups (alkinyl groups), optionally comprising one or more O- or F-atoms, a=0-3 m=0-2000 n=0-500.

4. The curable polyorganosiloxane composition according to claim 1, wherein component (B) is a compound of formula (2a):

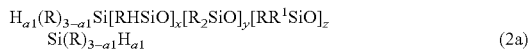  (2a)

wherein R is selected from optionally substituted alkyl with up to 30 carbon atoms, optionally substituted aryl with up to 30 carbon atoms, or poly($C_2$-$C_4$)-alkylene ether with up to 1000 alkylene oxy units, the groups R being free of aliphatic unsaturation, wherein $R^1$ is selected from aliphatic or aromatic groups with up to 30 carbon atoms, comprising C=C-group-containing groups (alkenyl groups) or C≡C-group-containing groups (alkinyl groups), optionally comprising one or more O- or F-atoms, a1 is 0-1, and 7≤x+y+z<1000.

5. Curable polyorganosiloxane composition according to claim 4, wherein R comprises at least one phenyl group.

6. Curable polyorganosiloxane composition according to claim 1, wherein component (C) is at least one transition metal compound, wherein the transition metal is selected from group consisting of nickel, ruthenium, rhodium, palladium, osmium, iridium, and platinum.

7. Curable polyorganosiloxane composition according to claim 1, wherein component (E) is selected from silica having a BET-surface of at least 150 $m^2$/g.

8. Curable polyorganosiloxane composition according to claim 1, said composition comprising:

100 parts by weight of component (A), 0.1 to 200 parts per weight of component (B), 0.5 to 1000 ppm of component (C), wherein component (C) is at least one transition metal compound, based on the amount of the transition metal in the component (C) and based on the total of components (A) and (B), 0.01 to 5 parts by weight of component (D), up to 50 parts by weight of component (E).

9. A photovoltaic module comprising the cured polyorganosiloxane composition according to claim 1.

10. A photovoltaic module comprising the cured polyorganosiloxane composition according to claim 2.

11. A photovoltaic module comprising the cured polyorganosiloxane composition according to claim 3.

12. A photovoltaic module comprising the cured polyorganosiloxane composition according to claim 4.

13. A photovoltaic module comprising the cured polyorganosiloxane composition according to claim 5.

14. A photovoltaic module comprising the cured polyorganosiloxane composition according to claim 6.

15. A photovoltaic module comprising the cured polyorganosiloxane composition according to claim 7.

16. A photovoltaic module comprising the cured polyorganosiloxane composition according to claim 8.

* * * * *